(12) United States Patent
Kimura

(10) Patent No.: US 6,933,612 B2
(45) Date of Patent: Aug. 23, 2005

(54) SEMICONDUCTOR DEVICE WITH IMPROVED HEATSINK STRUCTURE

(75) Inventor: Naoto Kimura, Kumamoto (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/687,999

(22) Filed: Oct. 17, 2003

(65) Prior Publication Data

US 2004/0080041 A1 Apr. 29, 2004

(30) Foreign Application Priority Data

Oct. 21, 2002 (JP) ........................................ 2002-305644

(51) Int. Cl.[7] .......................................... H01L 23/495
(52) U.S. Cl. ...................................... 257/778; 257/668
(58) Field of Search ................................. 257/668, 778, 257/787, 724, 675; 438/660, 107

(56) References Cited

U.S. PATENT DOCUMENTS 5,739,581 A * 4/1998 Chillara et al. ............. 257/668
6,201,701 B1 * 3/2001 Linden et al. ............... 361/720
6,452,113 B2 * 9/2002 Dibene et al. ............... 174/260

FOREIGN PATENT DOCUMENTS

| JP | 07-029940 | 1/1995 | ........... H01L/21/60 |
| JP | 08-064730 | 3/1996 | ........... H01L/23/34 |
| JP | 2000-174180 | 6/2000 | ........... H01L/23/36 |
| JP | 2002-164485 | 6/2002 | ........... H01L/23/42 |

* cited by examiner

Primary Examiner—Howard Weiss
Assistant Examiner—(Vikki) Hoa B. Trinh
(74) Attorney, Agent, or Firm—Hayes & Soloway P.C.

(57) ABSTRACT

A semiconductor device for an improved heatsink structure. The semiconductor device is composed of a first substrate, a first heatsink plate connected to the first substrate, a second substrate having a rear surfaces connected to the first heatsink plate, a semiconductor chip having a main surface bonded to a main surface of the second substrate, and a second heatsink plate connected to a rear surface of the semiconductor chip.

13 Claims, 6 Drawing Sheets

SEMICONDUCTOR DEVICE WITH IMPROVED HEATSINK STRUCTURE

BACKGROUND OF THE INVENTION

1. Field of the Invention

The present invention is related, in general, to packaged semiconductor devices, in particular, to heatsink structure of packaged semiconductor devices.

2. Description of the Related Art

In order to achieve efficient heat release, packaged semiconductor devices often adopt heatsink structure that allows heat release from both of the main and rear surfaces of semiconductor chips.

A packaged semiconductor device adopting such heatsink structure is disclosed in Japanese Unexamined Patent Application No. P2002-164485A. FIG. 1 shows the structure of the disclosed semiconductor device. The disclosed semiconductor device is composed of first and second insulating substrate 102 and 104 of aluminum nitride, which is highly thermally conductive, and first and second heatsinks 103 and 105 respectively connected to the first and second insulating substrate 102 and 104. This heatsink structure allows heat release from the main surface of a semiconductor chip 101 through the first insulating substrate 102 and the heatsink 103, while allowing heat release from the rear surface of the semiconductor chip 101 through the second insulating substrate 104 and the heatsink 105. The electrical connection between the semiconductor chip 101 and an external world is achieved by interconnections disposed on the insulating substrate 102, conductors 106 connected to the interconnections, bonding wires 107, and terminals 108.

Other heatsink structures allowing heat release from both of the main and rear surfaces of semiconductor chips are disclosed in Japanese Unexamined Patent Applications No. Jp-A-Heisei 7-29940, Jp-A-Heisei 8-64730, and P2000-174180A.

It would be advantageous if semiconductor device packages have an improved heat release efficiency.

It would be also advantageous if lengths of interconnections provided for semiconductor device packages to achieve are reduced. Shortened interconnections of semiconductor device packages effectively reduce signal delays therein, and also avoids impedance mismatching for high frequency signals.

SUMMARY OF THE INVENTION

In summary, the present invention addresses an improvement in heatsink structure of semiconductor device packages.

In detail, an object of the present invention is to improve heat release efficiency of semiconductor device packages.

Another object of the present invention is to reduce the lengths of interconnections of semiconductor device packages for electrical connections between the external world and the semiconductor chip.

In an aspect of the present invention, a semiconductor device is composed of a first substrate, a first heatsink plate connected to the first substrate, a second substrate having a rear surfaces connected to the first heatsink plate, a semiconductor chip having a main surface bonded to a main surface of the second substrate, and a second heatsink plate connected to a rear surface of the semiconductor chip.

When the semiconductor device includes a first pad coupled to a rear surface of the first substrate, and a second pad coupled to the main surface of the second substrate to be electrically connected to the semiconductor chip, it is advantageous if the first substrate includes a first interconnection therethrough connected to the first pad, the second substrate includes a second interconnection therethrough connected to the second pad, and the first heatsink plate includes a via contact providing an electrical connection between the first and second interconnections.

The first heatsink plate preferably includes a body portion disposed between the first and second substrates, and a side portion connected to the body portion to form an edge therebetween. The side portion is preferably perpendicular to the body portion.

In this case, the first heatsink plate preferably includes an upper portion connected to the side portion. The upper portion is preferably perpendicular to the side portion.

It is advantageous if the second heatsink plate is connected to the upper portion.

It is also advantageous if the first and second heatsink plate are connected to each other to form an enclosure around the semiconductor chip.

In another aspect of the present invention, a fabrication method of a semiconductor device is composed of:

coupling a rear surface of a first heatsink plate to a main surface of a first substrate;

coupling a rear surface of a second substrate to a main surface of the first heatsink plate;

flipchip bonding a semiconductor chip onto the main surface of the second substrate;

coupling a second heatsink plate to a rear surface of the semiconductor chip.

Advantageously, the method further includes:

folding the first heatsink plate on an edge to form body and side portions within the first heatsink plate, the body portion being disposed between the first and second substrates.

In this case, it is also advantageous if the method further includes:

folding the first heatsink plate on another edge to form upper portions connected to the side portions within the first heatsink plate.

The upper portions are preferably folded so as to be coupled to the second heatsink plate.

Preferably, the first and second heatsink plates form an enclosure around the semiconductor chip.

DESCRIPTION OF THE PREFERRED EMBODIMENTS

Preferred embodiments of the present invention are described below in detail with reference to the attached drawings.

Figure 1:
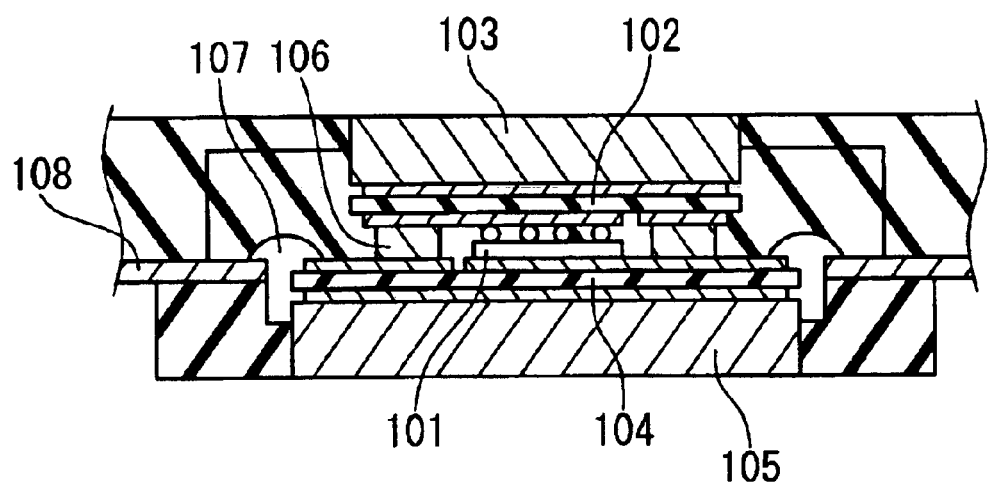
FIG. 1 is a section view of a conventional semiconductor device package.
Figure 2:
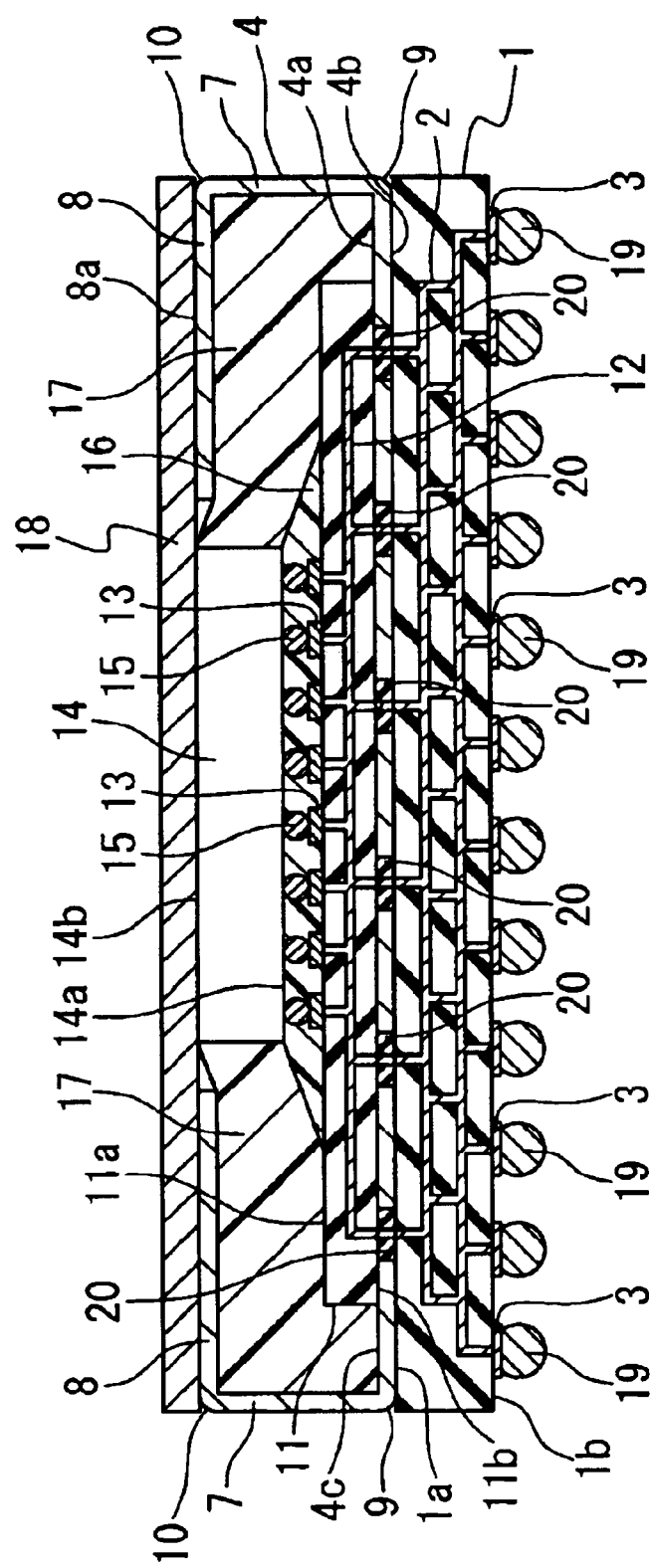
FIG. 2 is a section view of a semiconductor device in an embodiment according to the present invention.
Figure 3A:
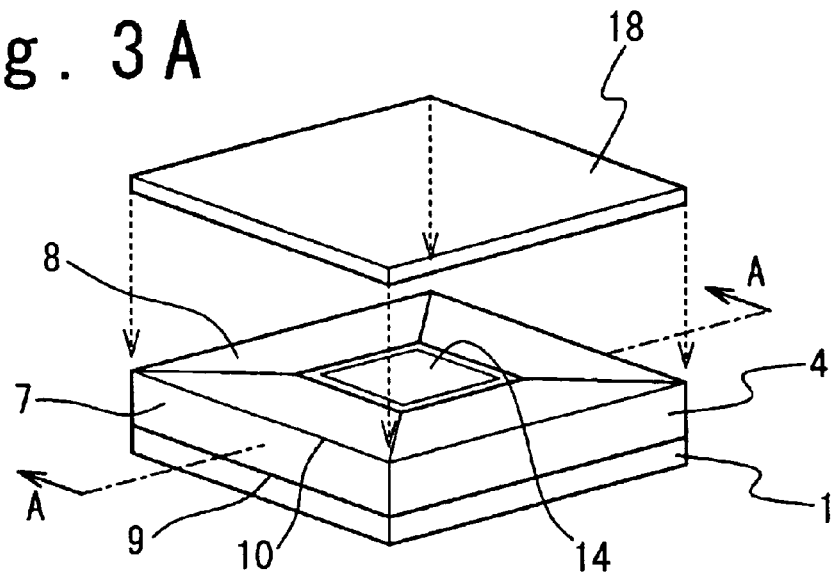
FIG. 3A is a perspective view of the semiconductor device.
Figure 3B:
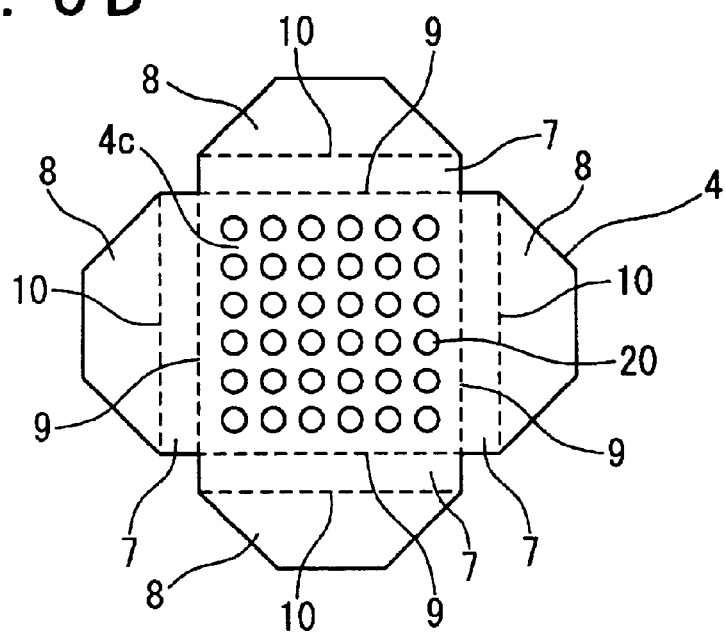
FIG. 3B is a development of an internal heatsink plate of the semiconductor device.

FIG. 2 illustrates a cross section structure of a semiconductor device in this embodiment in the section A—A shown in FIG. 3A. The semiconductor device in this embodiment includes a lower substrate 1, an internal heatsink plate 4, an intermediate substrate 11, and a semiconductor chip 14.

The lower substrate 1 is composed of a glass epoxy resin substrate through which internal interconnections 2 are disposed. The internal interconnections 2 includes power supply lines, grounded lines, and signal lines. The internal interconnections 2 are disposed to bridge the main surface 1a and the rear surface 1b of the lower substrate 1.

Metallic pads 3 and solder balls 19 are connected to the lower substrate 1. The pads 3 are disposed on the rear surface 1b of the lower substrate 1 to be connected to the internal interconnections 2. The pads 3 are arranged in rows and columns. The solder balls 19 are respectively connected to the pads 3.

The intermediate substrate 11 composed of a glass epoxy resin substrate through which internal interconnections 12 are disposed. The interconnections 12 includes power supply lines, grounded lines, and signal lines. The internal interconnections 12 are disposed to bridge the main surface 11a and the rear surface 11b of the intermediate substrate 11.

Metallic pads 13 are disposed on the main surface 11a of the intermediate substrate 11. The pads 13 are connected to the internal interconnections 13.

The internal heatsink plate 4 are disposed between the lower and intermediate substrates 1 and 11. As shown in FIGS. 2A and 2B, the internal heatsink plate 4 are made of a cross-shaped copper plate folded on edges 9 and 10. The internal heatsink plate 4 is composed of a body portion 4c defined by the edges 9, side portions 7 between the edges 9 and 10, and upper portions 8 defined by the edges 10. The main portion 4c is disposed between the lower and intermediate substrates 1 and 11. The side portions 7 are perpendicular to the main portion 4c, and the upper portions 8 are perpendicular to the associated side portions 7. The internal heatsink plate 4 is folded so that the upper portions 8 are parallel to the main portion 4c. Each of the side portions 7 has edges perpendicular to the edges 9 and 10, the perpendicular edges of each side portion 7 are in contact with the perpendicular edges of the adjacent side portions 7 when the internal heatsink plate 4 is folded. Each of the upper portions 8 has a pair of oblique edges forming an angle of 45 degrees to the associated edge 10. The oblique edges of each upper portion 8 are in contact with the oblique edges of the adjacent upper portions 8. This implies that the internal heatsink plate 4 is folded to have a box shape structure having an upward opening.

Figure 3C:
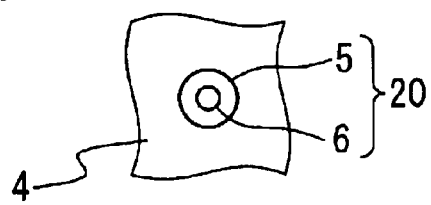
FIG. 3C is a plan view of via contacts disposed through the internal heatsink plate.

As shown in FIG. 2, the internal heatsink plate 4 has a plurality of via contacts 20 to achieve electrical connections between the internal interconnections 2 of the lower substrate 1 and the internal interconnections 12 of the intermediate substrate 11. As shown in FIG. 3C, each of the via contacts 20 includes an insulator 5, and a columnar conductor 6. The via contacts 20 are formed through the following manufacture process. After via holes are formed through the internal heatsink plate 4, the via holes are covered with the insulators 5. The columnar conductors 6 are then formed through the insulators 5. The conductors 6 are typically made from gold.

The rear surface 4b of the internal heatsink plate 4 is coupled to the main surface 1a of the lower substrate 1 by an adhesive. Hardening the adhesive generates a contractile force effected between the main surface 1a and the rear surface 4b, and thereby achieves electrical connections between the conductors 6 and the internal interconnections 2.

Correspondingly, the rear surface 11b of the intermediate substrate 11 is coupled to the main surface 4a of the internal heatsink plate 4 by an adhesive. A contractile force generated by hardening the adhesive achieves electrical connections between the conductors 6 and the internal interconnections 12. As a result, the pads 3 and 13 are electrically connected through the via contacts 20.

Referring back to FIG. 2, the semiconductor chip 14 is flipchip bonded onto the main surface 11a of the intermediate substrate 11. A plurality of bumps 15 are disposed on the main surface 14 of the semiconductor chip 14, and the semiconductor chip 14 is mounted facedown with the bumps 15 connected to the pads 13. This results in that the main surface 14a of the semiconductor chip 14 is opposed to the main surface 11a of the intermediate substrate 11. The space between the semiconductor chip 14 and the intermediate substrate 11 are filled with underfill resin 16. The space around the semiconductor chip 14 inside the internal heatsink plate 4 is filled with resin 17.

The rear surface 14b of the semiconductor chip 14 is connected to an external heatsink plate 18 made of a copper plate. The external heatsink plate 18 may be secured to the semiconductor chip 14 by solder or conductive adhesive. The external heatsink plate 18 is connected to the upper surfaces 8a of the upper portions 8 of the internal heatsink plate 4.

The heatsink structure constituted by the internal and external heatsink plates 4 and 18 forms an enclosure around the semiconductor chip 14 and the intermediate substrate 11, and thus provides an efficient electromagnetic shield. In addition, the connection of the external heatsink plate 18 and the upper portions 8 effectively improves heat release efficiency through an increase in the thickness of the heatsink structure.

FIGS. 4A to 4D and 5A to 5C illustrates a fabrication method of the semiconductor device in this embodiment.

Figure 4A:
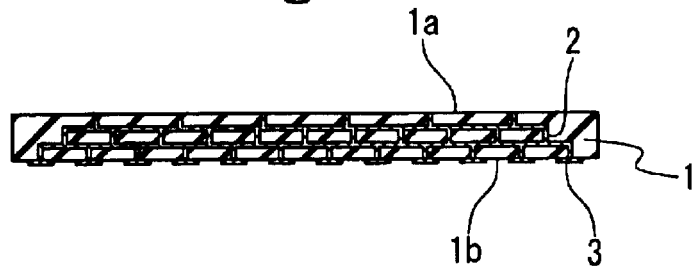
FIGS. 4A through 4D are section views illustrating steps of a fabrication method of the semiconductor device before the internal heatsink plate is bent.

As shown in FIG. 4A, the fabrication process begins with disposing the pads 3 onto the rear surface 1b of the lower substrate 1 so that the pads 3 are connected to the internal interconnections 2 within the lower substrate 1.

Figure 4B:
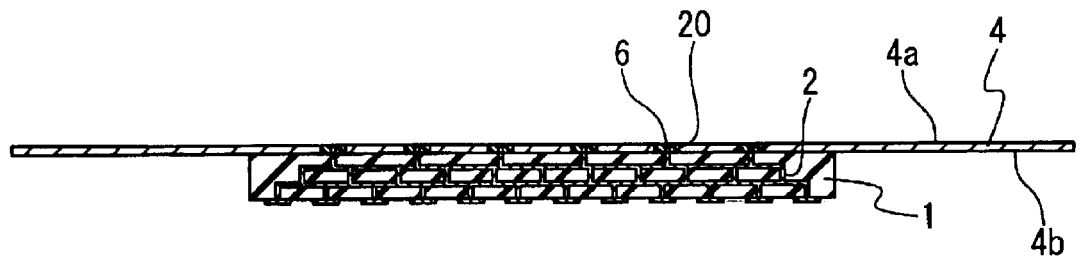

As shown in FIG. 4B, the rear surface 4b of the internal heatsink plate 4 is then connected to the main surface 1a of the lower substrate 1 by an adhesive to achieve electrical connections between the internal interconnections 2 and the conductors 6 within the via contacts 20.

Figure 4C:
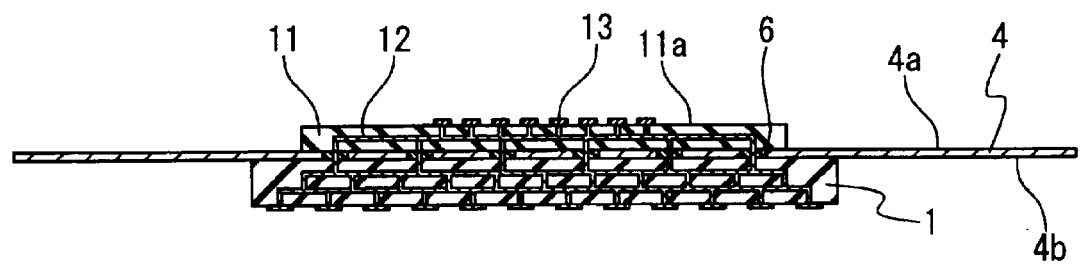

After forming the pads 13 on the main surface 11a of the intermediate substrate 11, as shown in FIG. 4C, the rear surface 11b of the intermediate substrate 11 is connected to the main surface 4a of the internal heatsink plate 4 by an adhesive to achieve electrical connections between the conductors 6 and the internal interconnections 12 within the intermediate substrate 11.

Figure 4D:
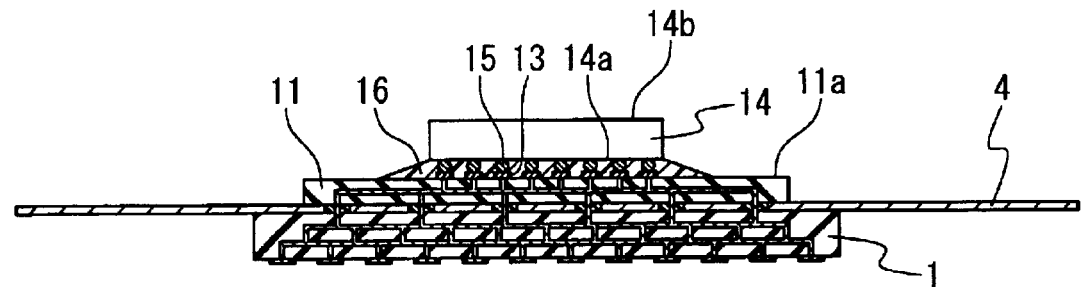

As shown in FIG. 4D, the bumps 15 disposed on the main surface 14a of the semiconductor chip 14 are then coupled to the pads 13 to achieve flipchip bonding. The semiconductor chip 14 is mounted facedown onto the main surface 11a of the intermediate substrate 11 so that the main surface 14a of the semiconductor chip 14 is opposed to the main surface 11a.

After achieving the flipchip bonding, the space between the semiconductor chip 14 and the intermediate substrate 11 are filled with the underfill resin 16.

Figure 5A:
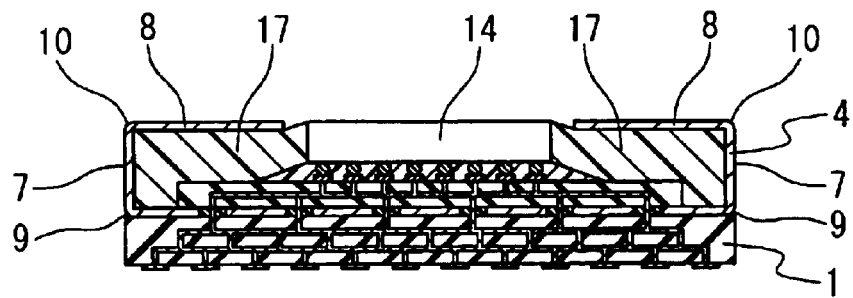
FIGS. 5A through 5C are section views illustrating the fabrication method of the semiconductor device after the internal heatsink plate is bent.

As shown in FIG. 5A, the internal heatsink plate 4 are then folded on the edges 9 and 10 to define the side portions 7 and the upper portions 8.

After folding the internal heatsink plate 4, the space inside the internal heatsink plate 4 is filled with the resin 7.

Figure 5B:
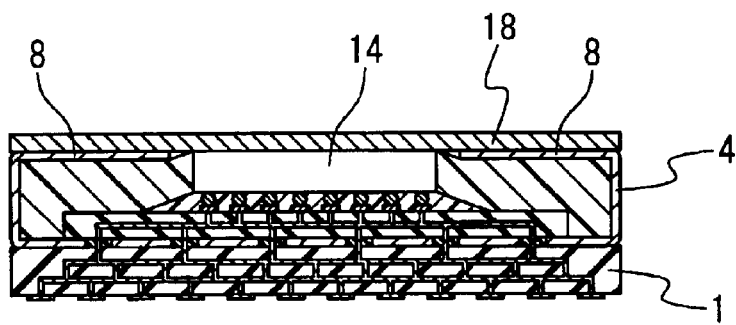

As shown in FIG. 5B, the external heatsink plate 18 is then connected to the rear surface 14b of the semiconductor chip 14 and the upper portion 8 of the internal heatsink plate 4 by solder or conductive adhesive.

Figure 5C:
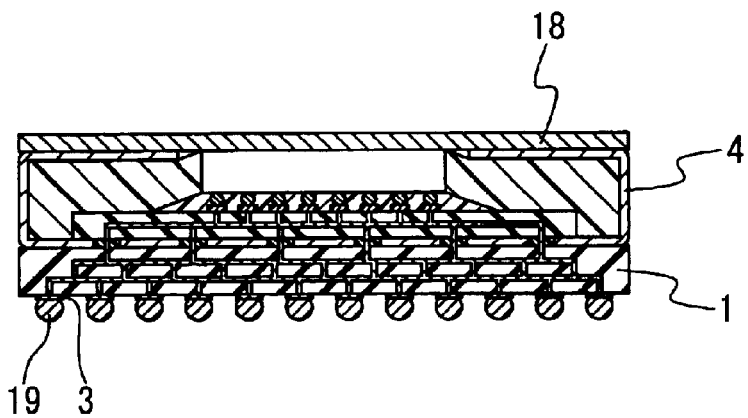

As shown in FIG. 5C, the solder balls 19 are then connected to the pads 3 to complete the semiconductor device in this embodiment.

Figure 6:
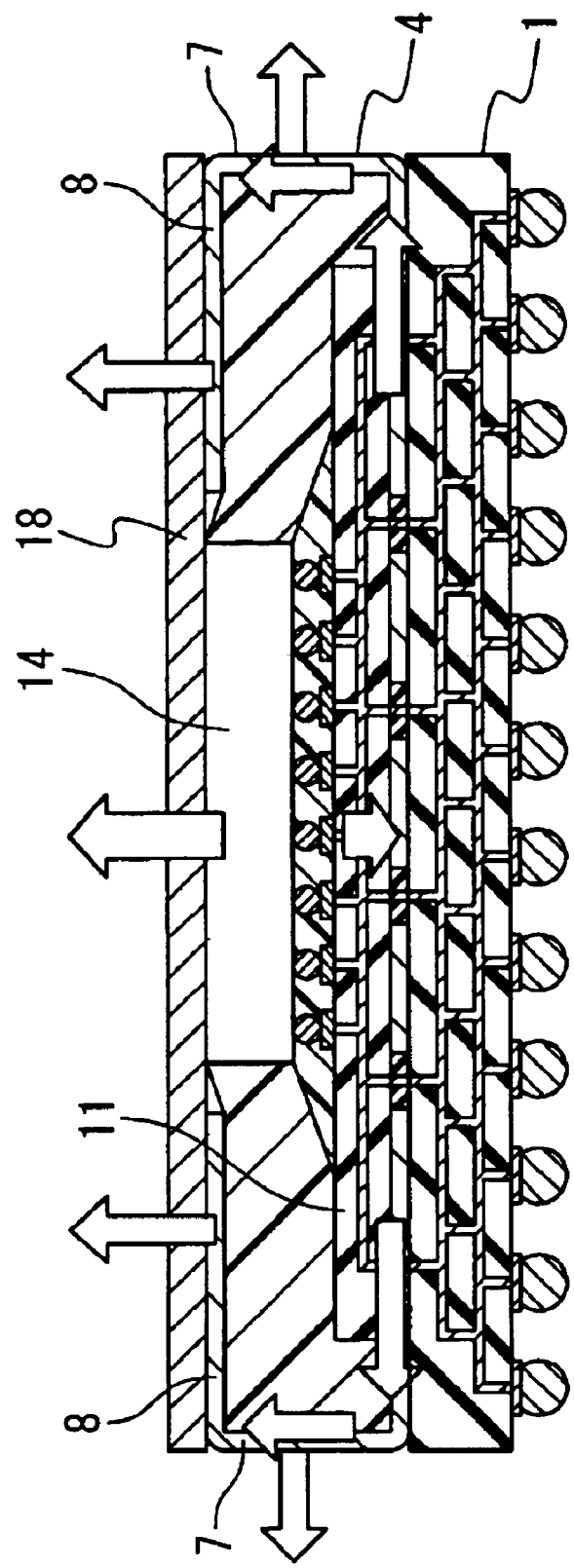
FIG. 6 shows the heat release mechanism of the semiconductor device.

The thus-described heatsink structure effectively improves heat release efficiency. As shown in FIG. 6, in which the heat release paths are illustrated by arrows 21, the internal heatsink plate 4 disposed between the lower substrate 1 and the intermediate substrate 11 allows the heat release from the main surface 14a of the semiconductor chip 14 through the side and upper portions 7 and 8. Furthermore, the external heatsink plate 18 allows heat generated in the semiconductor chip 14 to be directly released from the rear surface 14b to the external world. These features of the heatsink structure in this embodiment effectively achieves improved heat release efficiency. In addition, the connection of the external heatsink plate 18 and the upper portions 8 of the internal heatsink plate 4 reduces thermal resistance of the heatsink structure, and increases heat release area. This is also effective for improving heat release efficiency. The improved heat release efficiency allows the lower and intermediate substrates 1 and 11 to have a desirable multi-layered structure, which often suffers from poor heat release efficiency.

Another advantage of the heatsink structure in this embodiment is that the internal and external heatsink plates 4 and 18 provides an electromagnetic shield around the semiconductor chip 14 and the intermediate substrate 11. This effectively reduces electromagnetic interference (EMI) from the semiconductor device.

Still another advantage of the heatsink structure in this embodiment is that the heatsink structure enables the packaged semiconductor device to exclude bonding wires, and thereby effectively reduces the lengths of the interconnections within the packaged semiconductor device. Shortening the lengths of the interconnections effectively reduces signal delays, and also facilitates impedance matching for high frequency signals.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

For example, one skilled in the art would appreciate that the lower substrate 1 and/or the intermediate substrate 11 may be composed of a ceramic substrate, a resin tape substrate, a silicon substrate, or a laminated metal substrate.

Furthermore, one skilled in the art would appreciate that the internal and external heatsink plates 4 and 18 may be formed of an alloy plate or an iron plate instead of a copper plate.

What is claimed is:

1. A semiconductor device comprising:
   a first substrate;
   a first heatsink plate connected to said first substrate;
   a second substrate having main and rear surfaces, said rear surface of said second substrate being connected to said first heatsink plate;
   a semiconductor chip having a main surface bonded to said main surface of said second substrate;
   a second heatsink plate connected to a rear surface of said semiconductor chip;
   a first pad coupled to a rear surface of said first substrate; and
   a second pad coupled to said main surface of said second substrate to be electrically connected to said semiconductor chip,
   wherein said first substrate includes a first interconnection therethrough connected to said first pad,
   wherein said second substrate includes a second interconnection therethrough connected to said second pad, and
   wherein said first heatsink plate includes a via contact providing an electrical connection between said first and second interconnections.

2. The semiconductor device according to claim 1, wherein said first heatsink plate includes:
   a body portion disposed between said first and second substrates;
   a side portion connected to said body portion to form an edge therebetween.

3. The semiconductor device according to claim 2, wherein said side portion is perpendicular to said body portion.

4. The semiconductor device according to claim 2, wherein said first heatsink plate further includes an upper portion connected to said side portion.

5. The semiconductor device according to claim 4, wherein said upper portion is perpendicular to said side portion.

6. The semiconductor device according to claim 4, wherein said second heatsink plate is connected to said upper portion.

7. The semiconductor device according to claim 1, wherein said first and second heatsink plate are connected to each other to form an enclosure around said semiconductor chip.

8. A fabrication method of a semiconductor device comprising:
   coupling a rear surface of a first heatsink plate to a main surface of a first substrate;
   coupling a rear surface of a second substrate to a main surface of said first heatsink plate;
   flipchip bonding a semiconductor chip onto said main surface of said second substrate;
   coupling a second heatsink plate to a rear surface of said semiconductor chip;
   folding said first heatsink plate on an edge to form body and side portions within said first heatsink plate, said body portion being disposed between said first and second substrates.

9. The method according to claim 8, further comprising:
   folding said first heatsink plate on another edge to form upper portions connected to said side portions within said first heatsink plate.

10. The method according to claim 9, further comprising:
    coupling said second heatsink plate to said upper portions.

11. The method according to claim 10, wherein said first and second heatsink plates form an enclosure around said semiconductor chip.

12. A semiconductor device comprising:
    a first substrate;
    a first heatsink plate connected to said first substrate;
    a second substrate having main and rear surfaces, said rear surface of said second substrate being connected to said first heatsink plate;
    a semiconductor chip having a main surface bonded to said main surface of said second substrate;
    a second heatsink plate connected to a rear surface of said semiconductor chip without an insulating substrate of highly thermally conductive material.

13. The semiconductor device according to claim 12, wherein said first heatsink plate includes:
    a body portion disposed between said first and second substrates;
    a side portion connected to said body portion to form an edge therebetween.

* * * * *

UNITED STATES PATENT AND TRADEMARK OFFICE
CERTIFICATE OF CORRECTION

PATENT NO. : 6,933,612 B2  Page 1 of 1
DATED : August 23, 2005
INVENTOR(S) : Kimura It is certified that error appears in the above-identified patent and that said Letters Patent is hereby corrected as shown below:

Column 5,
Line 57, "chin" should be -- chip --.

Signed and Sealed this

Thirteenth Day of June, 2006

JON W. DUDAS
*Director of the United States Patent and Trademark Office*